(12) United States Patent
Forrest et al.

(10) Patent No.: US 7,179,534 B2
(45) Date of Patent: Feb. 20, 2007

(54) CONDUCTIVE-POLYMER ELECTRONIC SWITCH

(75) Inventors: Stephen Forrest, Princeton, NJ (US); Sven Moeller, Corvallis, OR (US)

(73) Assignee: Princeton University, Princeton, NJ (US)

( * ) Notice: Subject to any disclaimer, the term of this patent is extended or adjusted under 35 U.S.C. 154(b) by 406 days.

(21) Appl. No.: 10/356,394

(22) Filed: Jan. 31, 2003

(65) Prior Publication Data

US 2004/0149552 A1 Aug. 5, 2004

(51) Int. Cl.
*B32B 27/00* (2006.01)
*B32B 27/16* (2006.01)

(52) U.S. Cl. ............... 428/411.1; 428/457; 428/500

(58) Field of Classification Search ............ 428/411.1, 428/500, 457; 257/40
See application file for complete search history.

(56) References Cited

U.S. PATENT DOCUMENTS 6,236,587 B1 * 5/2001 Gudesen et al. ............ 365/105
6,528,815 B1 * 3/2003 Brown et al. ................ 257/40

* cited by examiner

*Primary Examiner*—Ramsey Zacharia
(74) *Attorney, Agent, or Firm*—Olympic Patent Works, PLLC

(57) ABSTRACT

A switch, used as an electronic-memory element, comprising a conductive organic polymer layer sandwiched between, and in contact with, two metallic conductive elements. In an initial post-fabrication state, the organic polymer layer is relatively highly conductive, the post-fabrication constituting a first stable state of the memory element that can serve to represent a binary bit "1 or 0," depending which of two possible encoding conventions is employed. A relatively high voltage pulse can be passed between the two metal conductive elements, resulting in a market decrease in the current-carrying capacity of the organic polymer layer sandwiched between the two conductive elements. This change in conductivity of the organic polymer layer is generally irreversible, and constitutes a second stable state of the memory element that may be used to encode a binary bit "0" or "1," again depending on which of two possible encoding conventions are employed. Organic-polymer-based memory elements, modified to include an additional diode-acting layer, may be fabricated in dense, two-dimensional arrays.

10 Claims, 13 Drawing Sheets

CONDUCTIVE-POLYMER ELECTRONIC SWITCH

TECHNICAL FIELD

The present invention relates to electronic switches and, in particular, to an efficient, robust, easy-to-manufacture, conductive-polymer-based electronic switch that can be used as a basic element of an electronic memory.

BACKGROUND OF THE INVENTION

Two-state electronic switches are widely used in modern electronics, from basic circuits to microprocessors to electronic memories. An electronic memory comprises a large number of ordered and electrically indexed switches, the state of each switch representing a binary "1" or "0" value or, in other words, a bit of information. Many different types of electronic memories are currently used in computers, in various types of intelligent electronic devices and controllers, and in many popular commercial products, including digital cameras and video recorders. While many applications require dynamic electronic memories that can be repeatedly written and read, many other applications require only static electronic memories that can be written only once, and then read repeatedly. Example write-once, read-many-times ("WORM") memory devices include commonly used and optically accessed write-once compact discs, various well-known, read-only memories ("ROMs"), and various types of electronically accessed, microfuse-based crosspoint memories. WORM memories may be significantly less expensive than memories that can be repeatedly read and written, and may find great utility in applications requiring large, robust and resilient memory devices, including digital photography, where inexpensive WORM memories may be used for storing digital images in a fashion analogous to storing analogue optical images on photographic film.

In order to produce inexpensive and robust WORM memories, the process by which the millions of switches that together comprise a memory are fabricated needs to be as simple as possible, using only a small number of easily automated steps to produce a functional electronic data-storage medium. Moreover, for use in consumer devices, it is important that the electronic memory be relatively robust and relatively insensitive to mechanical shock, temperature changes, slow chemical degradation, and a variety of other environmental insults to which consumer products are commonly exposed and other types of inherent physical instabilities. Simplicity of design may, by itself, greatly facilitate robustness, because every additional component or feature may represent an additional failure point. Thus, for a variety of reasons, inexpensive, stable, and easily manufactured WORM memories are of great potential utility in current and future consumer products. Designers, manufacturers, and users of electronic memories, and, in particular, designers, manufacturers, and users of consumer devices that include inexpensive WORM memories, have thus recognized the need for robust, inexpensive, and easily manufactured WORM memories.

SUMMARY OF THE INVENTION

One embodiment of the present invention is a switch, used as an electronic-memory element, comprising a conductive organic polymer layer sandwiched between, and in contact with, two metallic conductive elements. In its initial post-fabrication state, the organic polymer layer is relatively highly conductive, conducting current between the two metallic conductive elements when a voltage differential is applied to the conductive elements with relatively low resistance. This highly conductive state of the organic polymer constitutes a first stable state of the memory element that can serve to represent a binary bit "1" or "0," depending which of two possible binary encoding conventions is employed. A relatively high voltage pulse can be passed between the two metal conductive elements, resulting in a marked decrease in the current-carrying capacity of the organic polymer layer sandwiched between the two conductive elements. This change in conductivity of the organic polymer layer is generally irreversible, and constitutes a second stable state of the memory element that may be used to encode a binary bit "0" or "1," again depending on which of two possible encoding conventions are employed, opposite from the binary bit encoded by the first stable state. A two-dimensional array of organic-polymer-based memory elements is obtained by forming a first layer of parallel, conductive signal lines, coating the first layer of parallel conductive signal lines with a layer of a first semiconductor, such as a doped silicon layer, that acts as a diode within each memory element, applying the organic polymer layer, and then fabricating a second layer of conductive signal lines on top of the organic polymer layer, the signal lines of the first layer oriented at an angle with respect to the signal lines of the second layer, the angle generally between 30 and 120 degrees. Each overlap of a signal line in the first layer of signal lines with a signal line in the second layer of signal lines, along with the semiconductor and organic polymer layers between the signal lines of the first and second layer in the overlap region, constitutes a single memory element.

DETAILED DESCRIPTION OF THE INVENTION

One embodiment of the present invention is a switch, used as a WORM memory element, comprising a thin layer of a conductive organic polymer sandwiched between, and in contact with, two metallic conductive elements. A suitable, conductive, organic polymer is obtained from a two-component, conductive polymer mixture including poly(3,4-thylenedioxythiophene) and poly(styrene sulfonate) ("PEDT/PSS"). The PEDT/PSS layer is relatively highly conductive following initial fabrication. However, the PEDT/PSS layer between the two metallic conductive elements can be subjected to a relatively high voltage pulse to be irreversibly switched to a much less conductive state. Both states are stable when subjected to relatively low-voltage currents that can be employed to query the state of the memory element.

Figure 1:
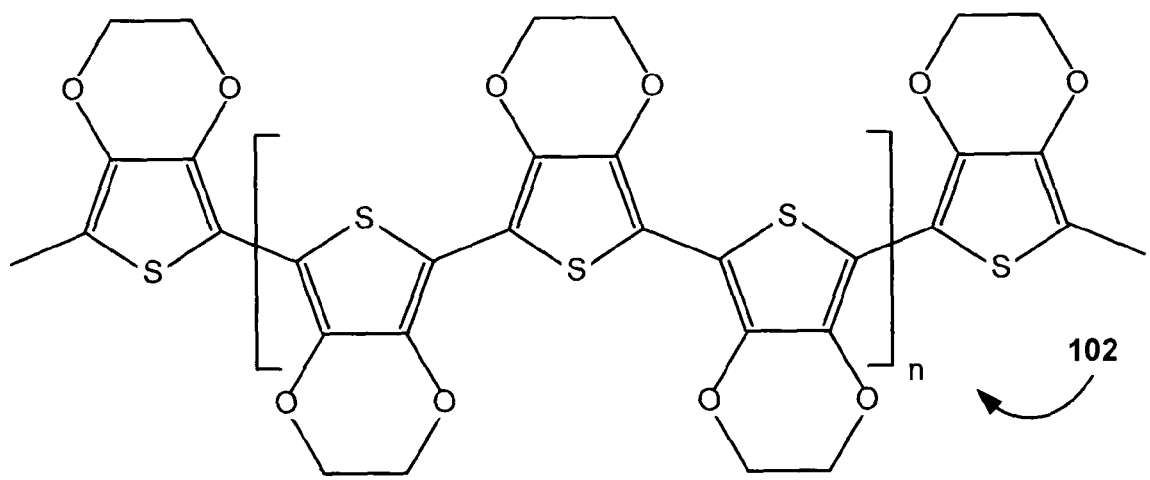
FIG. 1 shows the chemical structure of a PEDT/PSS polymer mixture.
Figure 1:
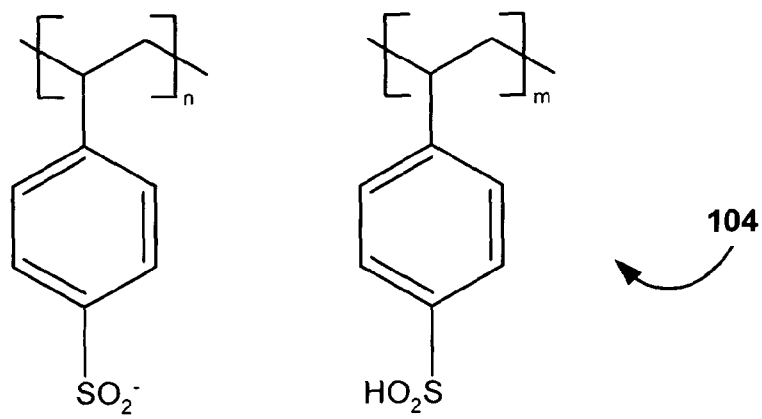

FIG. 1 shows the chemical structure of the PEDT/PSS polymer mixture, known by the trade name Baytron® P. The PEDT/PSS conductive polymer mixture is a mixture of a poly(3,4-ethylenedioxythiophene) polymer 102 and poly (styrene sulfonate) polymers 104. Baytron® P is prepared as an aqueous dispersion of a mixture of PEDT and PSS polymers. In general, the PEDT/PSS aqueous dispersion is spun onto a surface, to which it adheres upon drying to form an intrinsically conductive, transparent, and virtually colorless coating. PEDT/PSS has relatively high conductivity for an organic polymer, and can support current densities of greater than 200 amperes per $cm^2$. PEDT/PSS has good photo stability and good thermal stability, and is relatively resistant to hydrolysis.

Figure 2A:
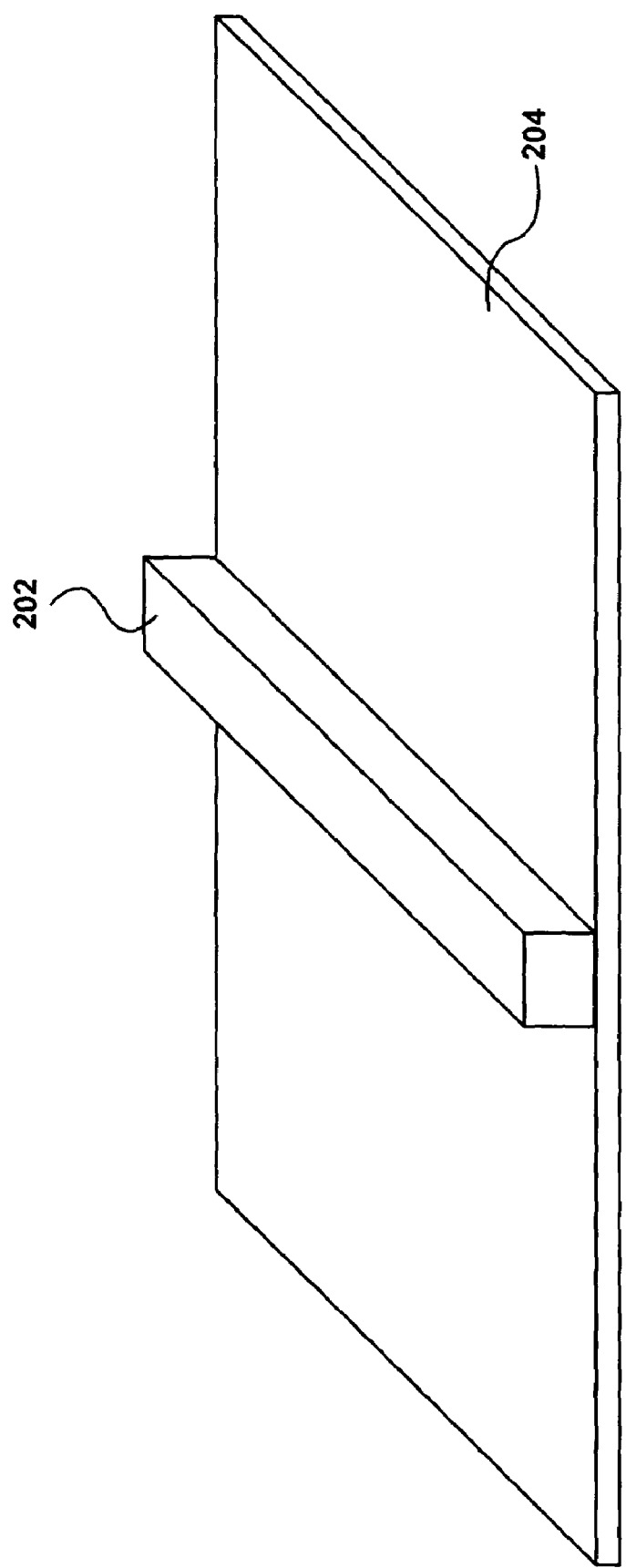
FIGS. 2A–E illustrate preparation of a single memory element according to an embodiment of the present invention.
Figure 2B:
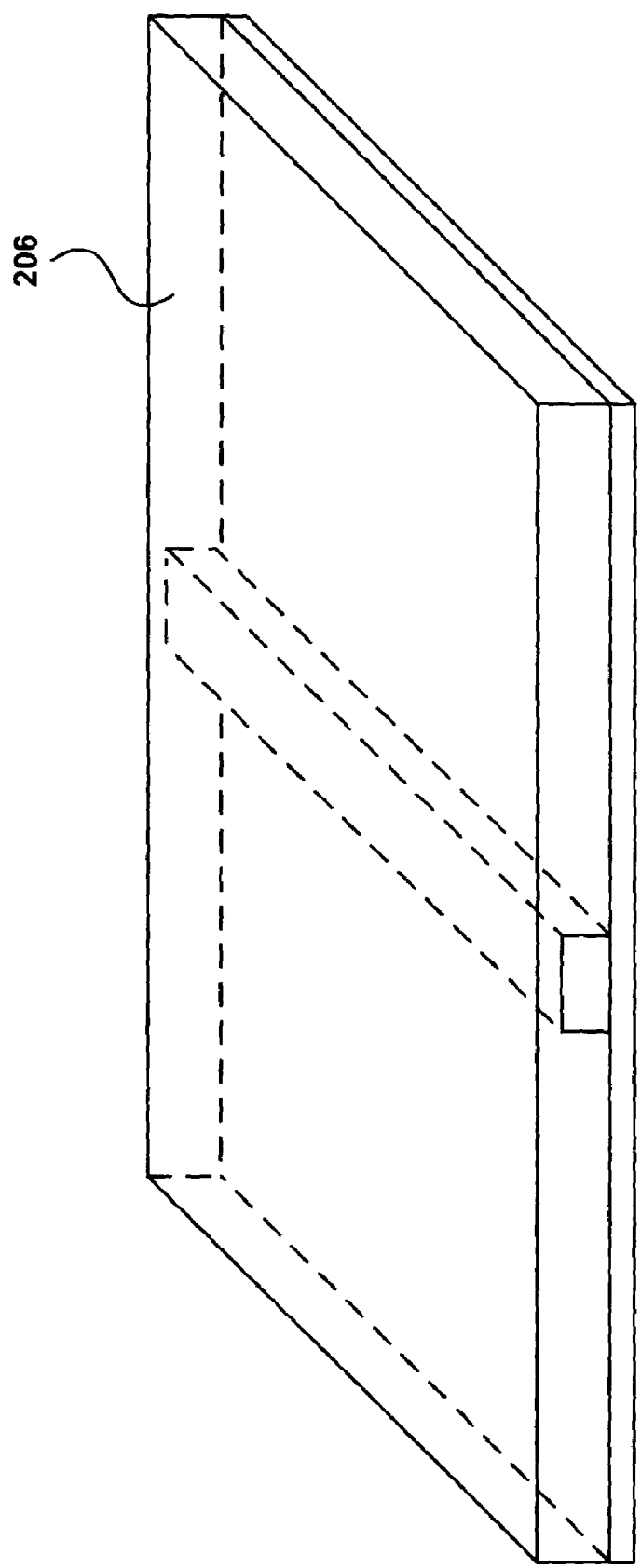
Figure 2C:
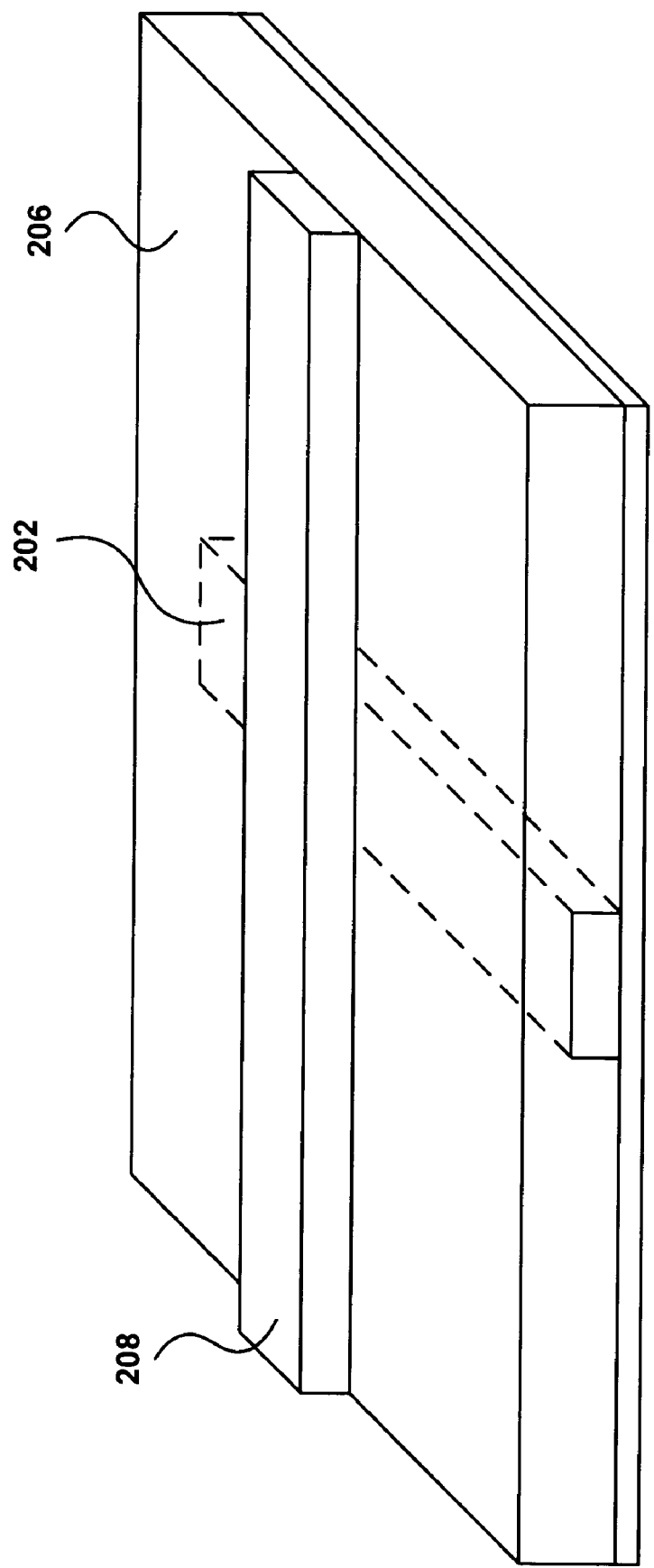
Figure 2D:
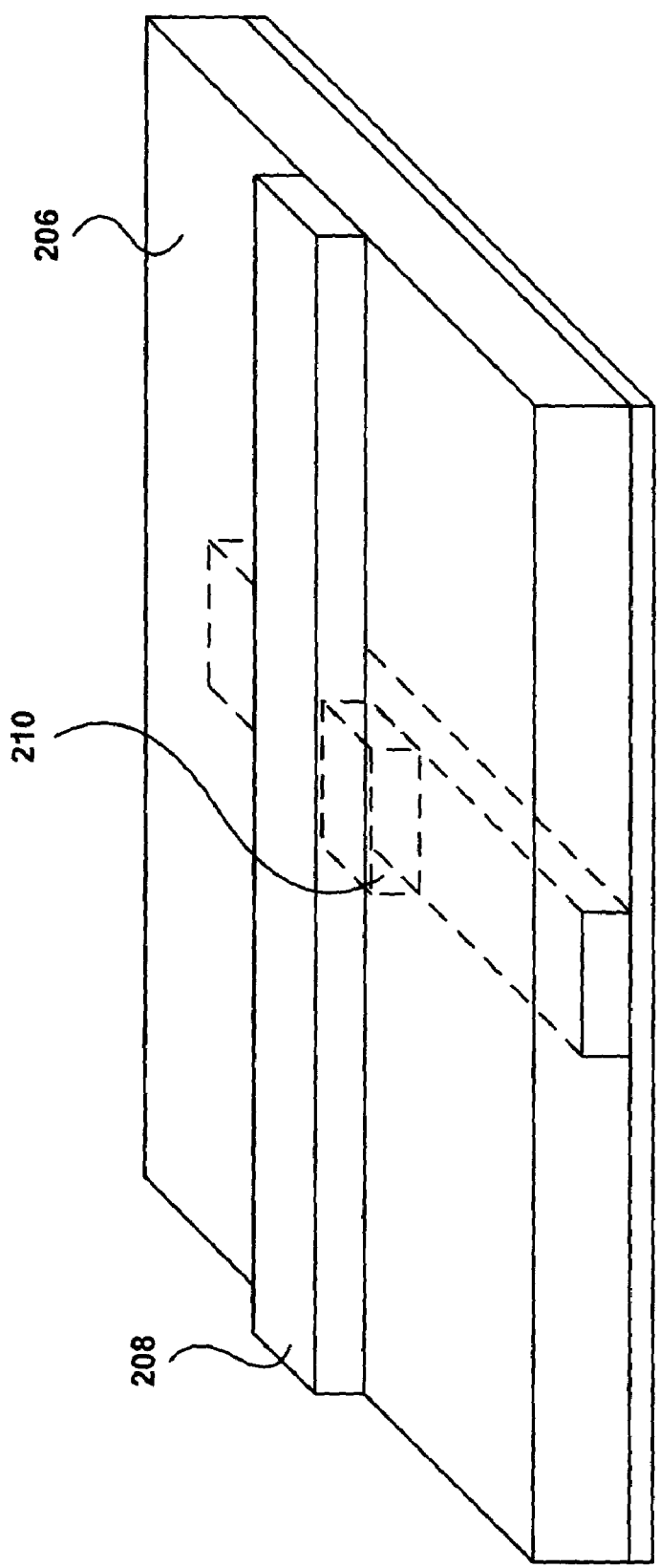

FIGS. 2A–E illustrate preparation of a single memory element according to an embodiment of the present invention. As shown in FIG. 2A, a first metallic signal line 202 is formed on a substrate 204. The substrate may be any of a large variety of dielectric or insulator materials, such as silicon dioxide, glass, various ceramic materials, and other such substrate materials. The conductive signal line 202 may be formed using common semiconductor-fabrication techniques, including photolithography-and-etching-based techniques. In commercial applications, microscale and even nanoscale signal lines may be employed, the size of the signal lines constrained primarily by their resistivity. Next, as shown in FIG. 2B, the signal line and substrate is covered with a layer of PEDT/PSS 206. The PEDT/PSS layer is commonly applied by spinning an aqueous dispersion of the PEDT/PSS onto the substrate and signal line. Other techniques for forming thin PEDT/PSS layers similar to many commercial techniques for applying coatings to optics and to other precision instruments may be used. As shown in FIG. 2C, when the PEDT/PSS layer 206 has dried, a second metallic signal line 208 is fabricated on the surface of the dried PEDT/PSS layer. In general, the second signal line 208 is oriented approximately orthogonally to the first signal line 202, but, as pointed out above, the orientation angle between the two signal lines may vary over a considerable range of angles and still produce a working memory element. As shown in FIG. 2D, the volume of PEDT/PSS 210 overlying the first signal line 202 and underlying the second signal line 208 within the overlap region of the two signal lines 202 and 208, along with the two signal lines 206 and 208, constitutes a memory element. It is this intersection volume 210, along with an additional volume of the PEDT/PSS layer surrounding the intersection volume 210, through which current is conducted when a voltage differential is applied to the two signal lines.

Figure 2E:
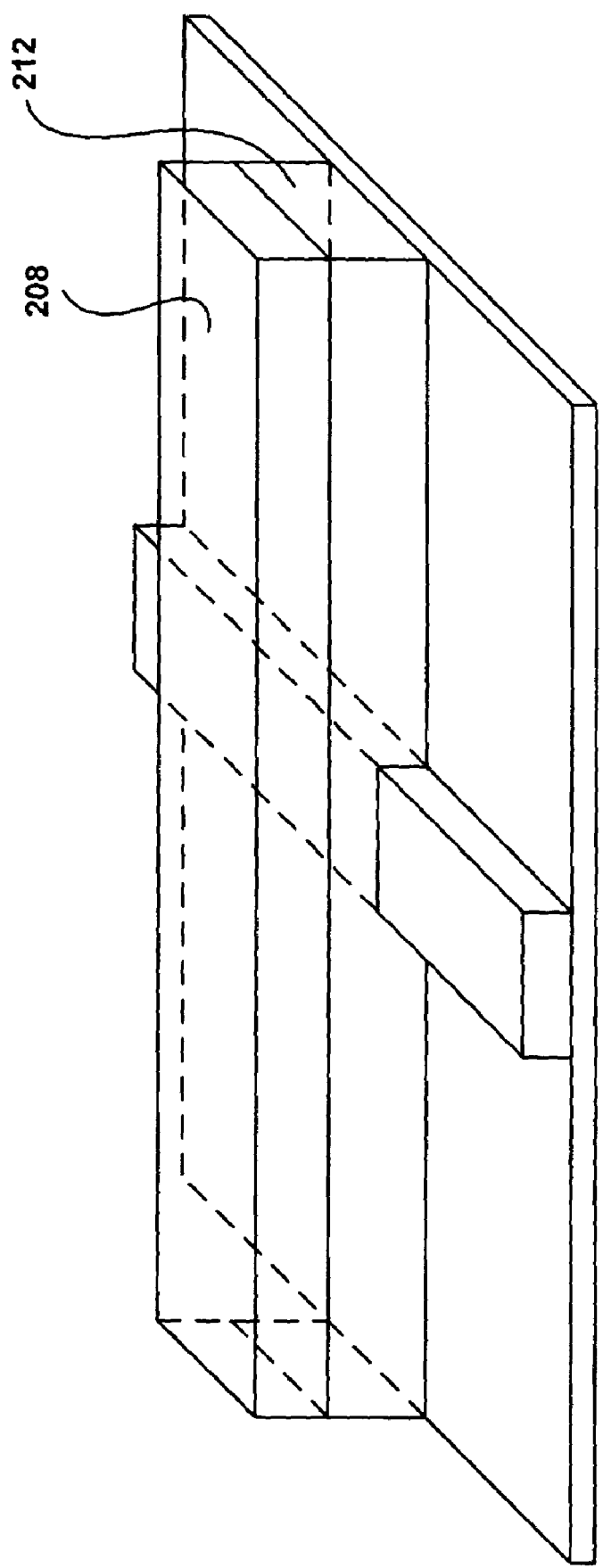

In certain applications, especially in those in which the dimensions of the signal lines approach the lower end of microscale dimensions, the PEDT/PSS layer surrounding the intersection volume (210 in FIG. 2D) may contribute to cross talk between adjacent memory elements, and to other undesirable effects. In such cases, an additional etching step may be used to remove all but that portion of the PEDT/PSS layer underlying the second signal line. As shown in FIG. 2E, the second signal line 208 may serve as an etch mask, shielding an underlying layer 212 of PEDT/PSS during an etching process. Removal of a large portion of the PEDT/PSS layer significantly decreases any chance of electrical communication between adjacent memory elements. It is also possible to fully or partially remove all but the intersection volumes (210 in FIG. 2D) of the PEDT/PSS layer using any of a variety of semiconductor-fabrication techniques.

Figure 3:
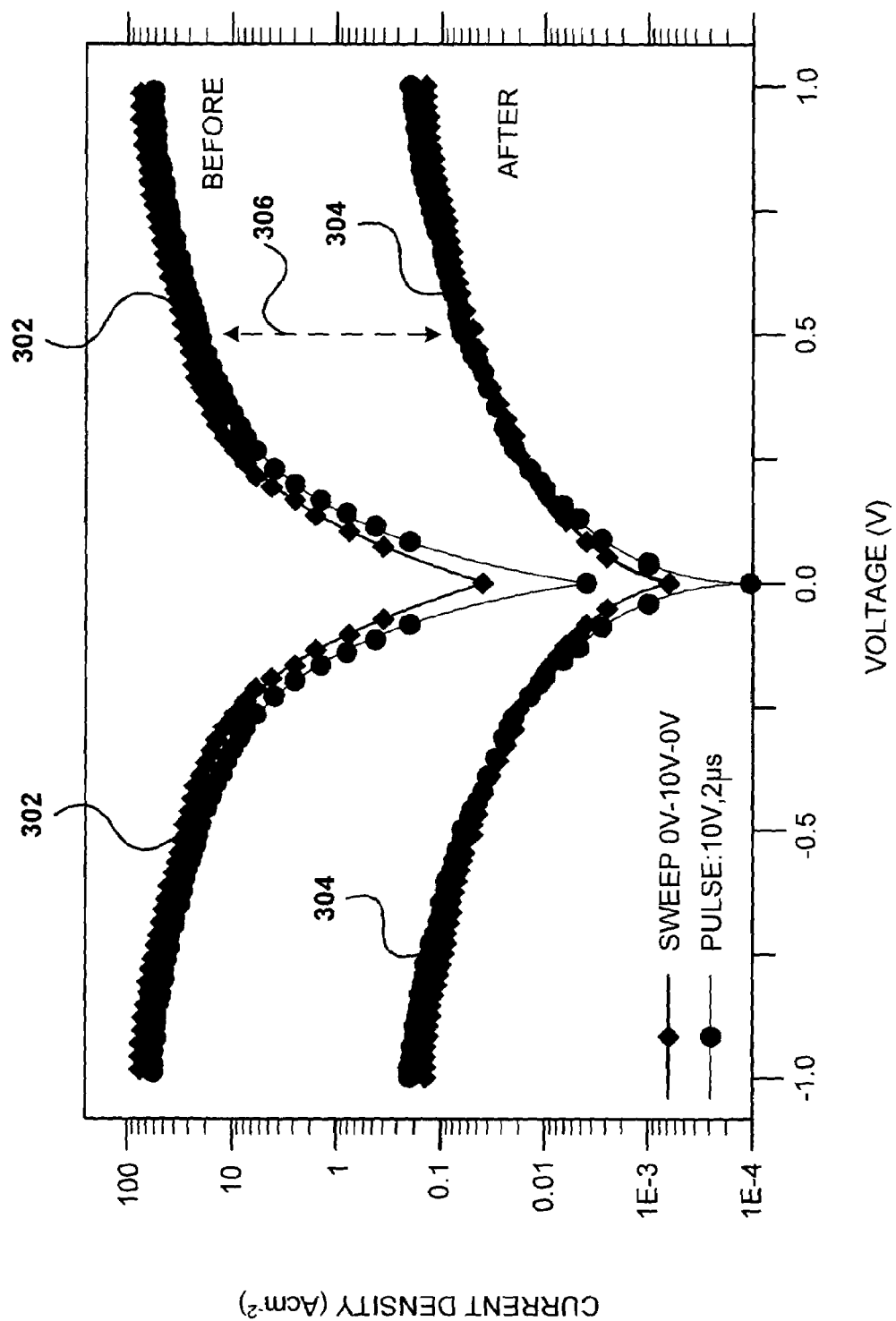
FIG. 3 shows the graphical relationship between a current density within an intersection volume of PEDT/PSS and a voltage differential applied to metallic signal lines between which the intersection volume is sandwiched.

FIG. 3 shows the graphical relationship between a current density within an intersection volume of PEDT/PSS (210 in FIG. 2D) and a voltage differential applied to metallic signal lines between which the intersection volume is sandwiched. In FIG. 3, a first set of curves 302 represents the current density within an intersection volume of PEDT/PSS when the PEDT/PSS is in its initial, post fabrication state, and has not experienced a relatively high voltage pulse that irreversibly increases its electrical resistance. A second of curves 304 in FIG. 3 represents the relationship between current density and voltage differential applied to the signal lines underlying and overlying an intersection volume of PEDT/PSS after the intersection volume has been subject to a relatively high voltage pulse. As shown in FIG. 3, there is a significant difference 306 between the current density within an intersection volume of PEDT/PSS in an initial, post fabrication state 302 and an intersection volume that has experienced a relatively high voltage pulse 304. Current density differences of between 2 and 3 orders of magnitude have been observed.

Figure 4:
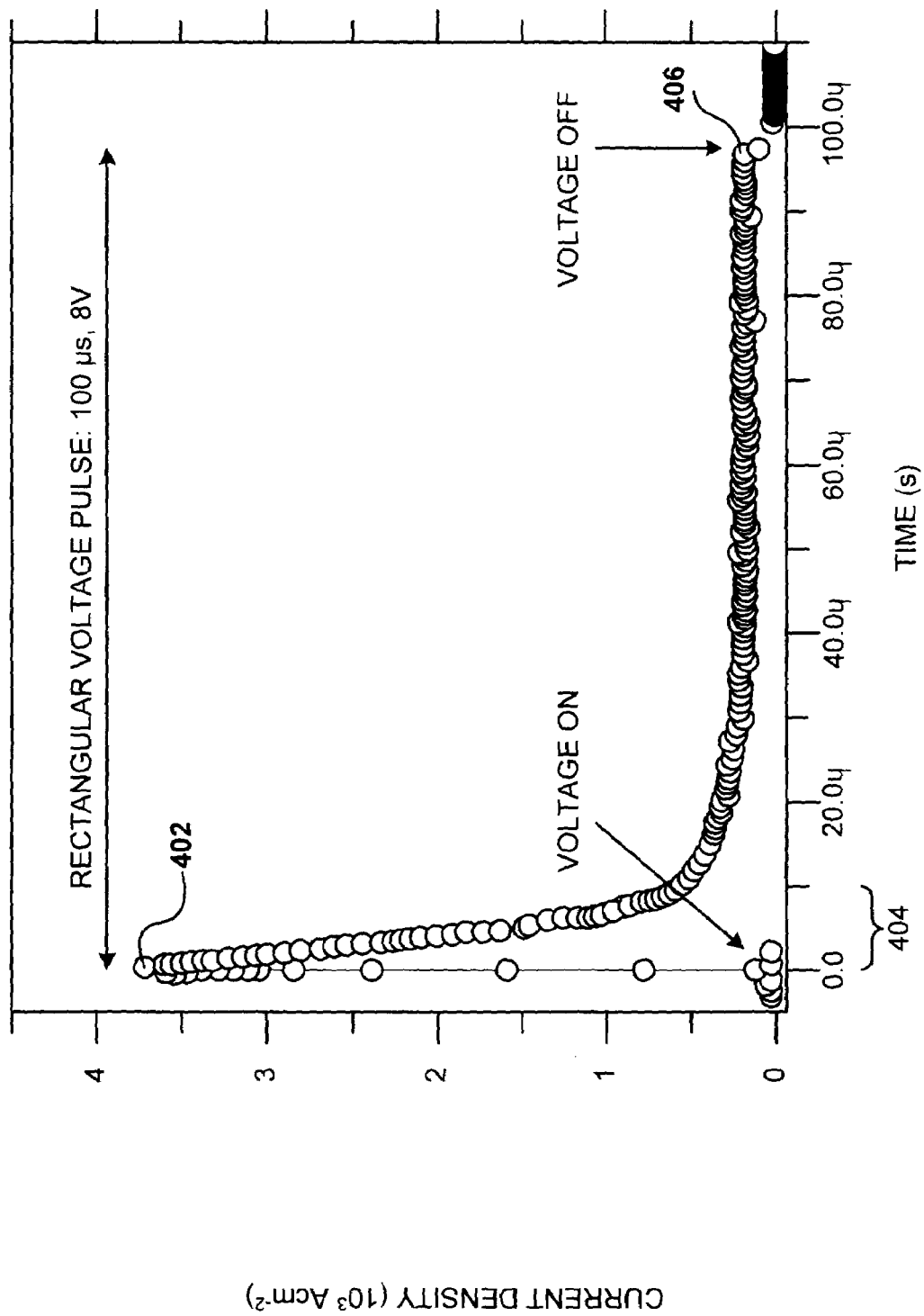
FIG. 4 shows the decay of current density with respect to time within an intersection volume of PEDT/PSS during application of a high-voltage pulse to the intersection volume.

FIG. 4 shows the decay of current density with respect to time within an intersection volume of PEDT/PSS, in a relatively low-resistance, post-manufacture state, during application of a high-voltage pulse to the intersection volume. As shown in FIG. 4, the current density within the intersection volume, represented by data point 402, is initially relatively high at the beginning of an 8V, 100 microsecond voltage pulse. However, in the first 10 microsecond interval 404, the current density steeply decreases to, and then remains at, a relatively low value, represented, for example, by data point 406. The high-voltage-induced change in current density is stable. A PEDT/PSS-based electrical memory element is normally read using signal line voltage differentials corresponding to an operating voltage of generally below 2 volts, at which voltages the relatively low resistance of an intersection volume not exposed to a high-voltage pulse does not appreciably change.

Figure 5:
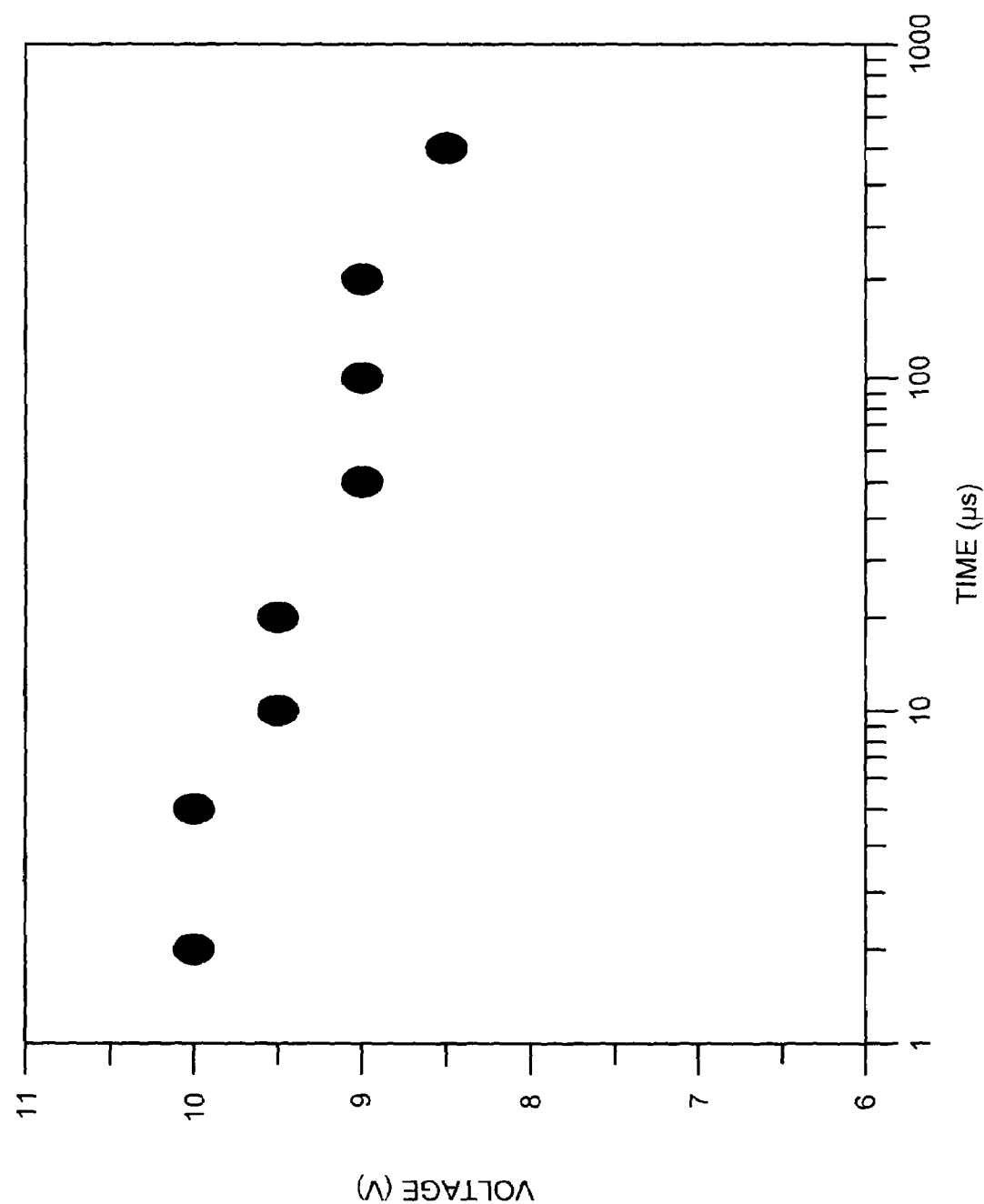
FIG. 5 shows a relationship between the voltages employed in relatively high-voltage pulses to transform an intersection volume of PEDT/PSS from the relatively low-resistance, post-manufacture state to a relatively high resistance state and the time that the high-voltage is applied to the to intersection volume.

FIG. 5 shows the relationship between the voltages employed in relatively high-voltage pulses to transform an intersection volume of PEDT/PSS from the relatively low-resistance, post-manufacture state to a relatively high resistance state and the time that the high-voltage is applied to the to intersection volume. As shown in FIG. 5, the pulse voltages are significantly higher than the operating voltages of less than 2 volts, and decrease from 10 volts applied for 2 microseconds to 8.5 volts applied for 0.5 seconds. At even higher applied voltages, the intersection volume of the PEDT/PSS layer may fail altogether.

Figure 6A:
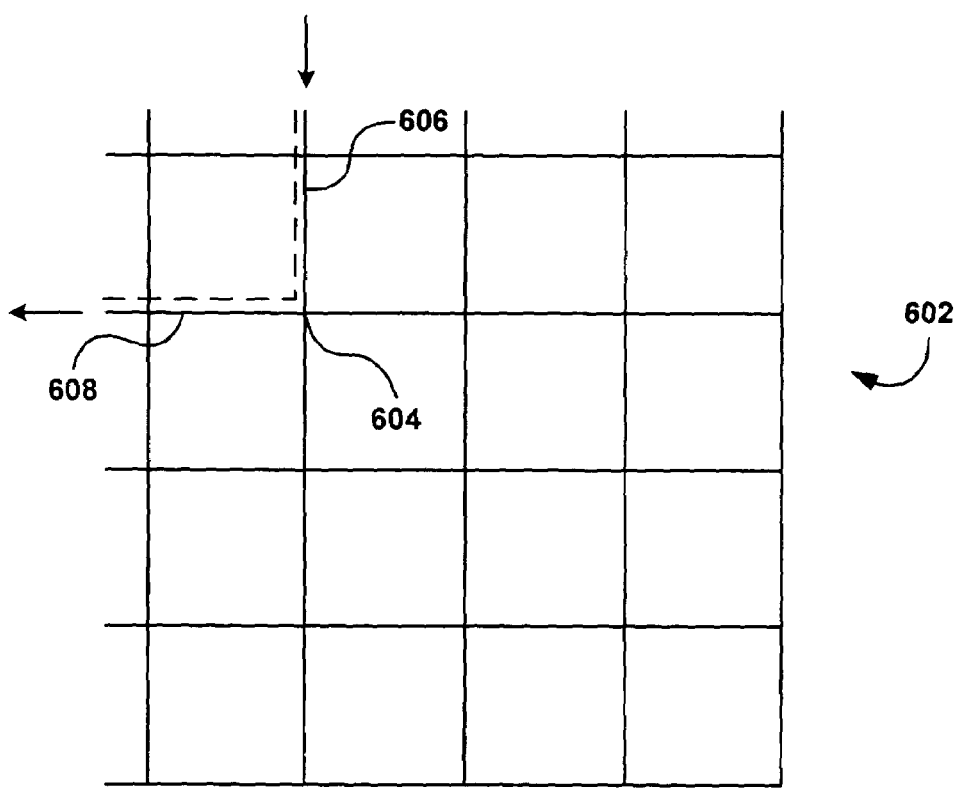
FIGS. 6A–C illustrate a problem arising in memory-element arrays as well as a solution to the problem.
Figure 6B:
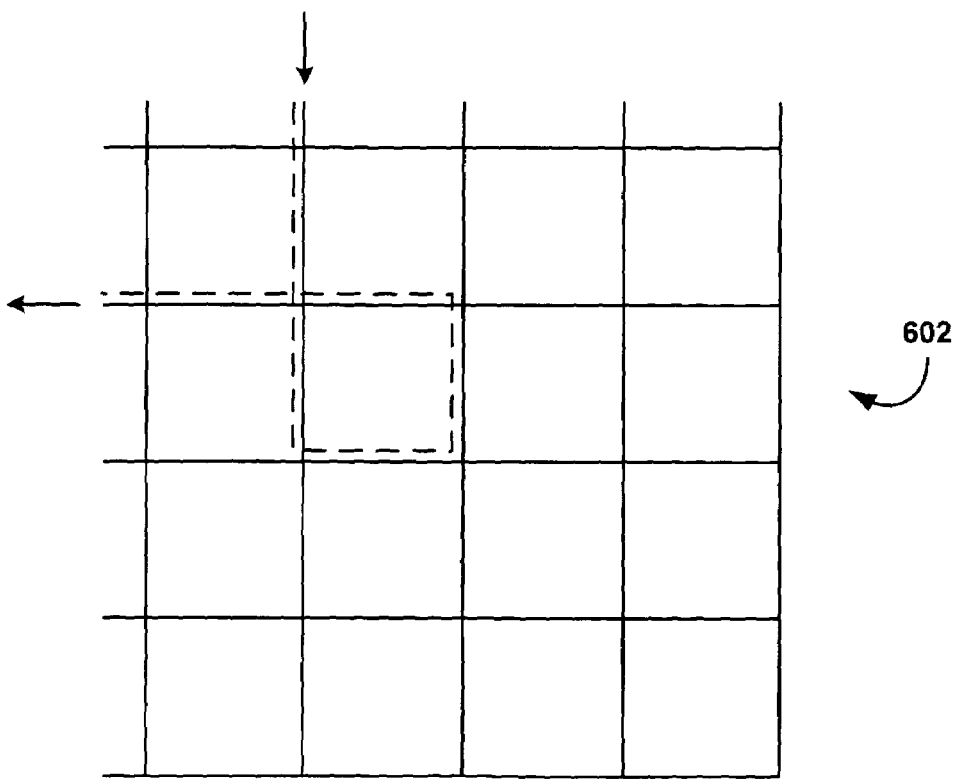
Figure 6C:
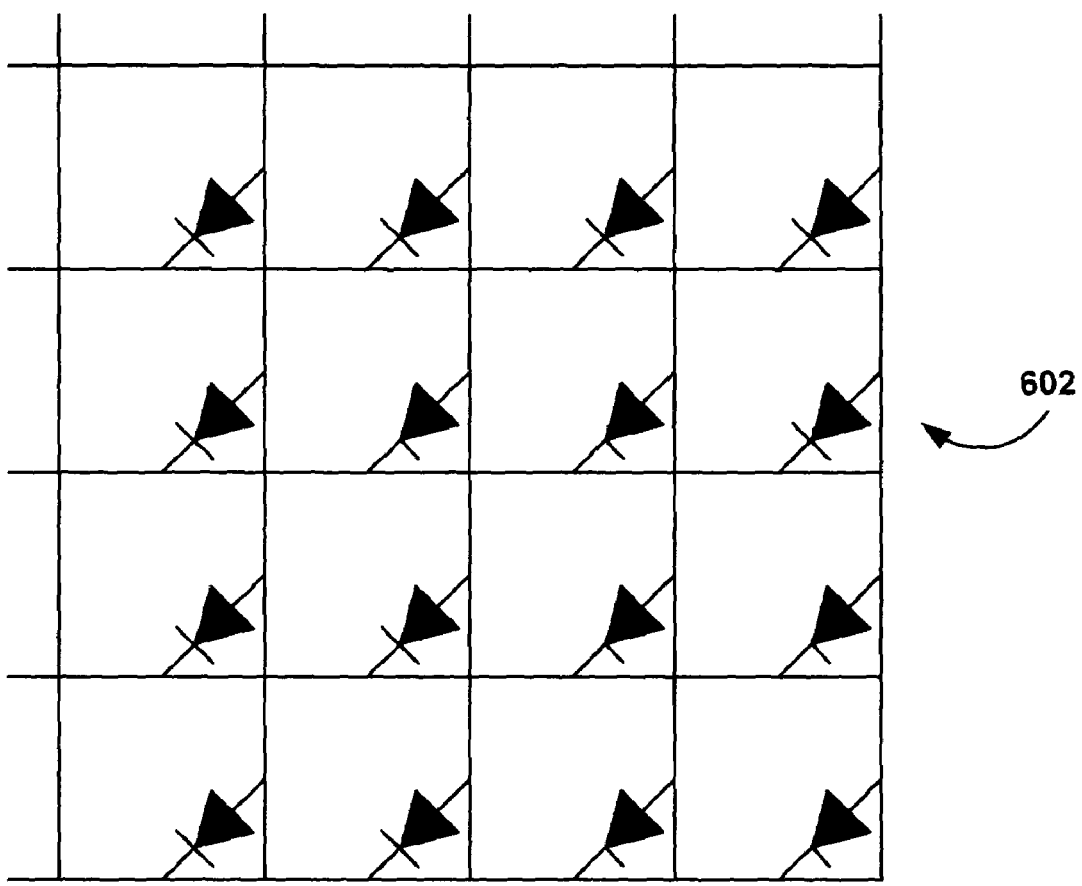

As discussed above, a large number of memory elements, such as the memory element discussed above with reference to FIGS. 2A–E, are intended to be combined into an array of memory elements constituting a high-density, matrix-like electronic memory. However, the memory elements require an additional semiconductor layer in such applications. FIGS. 6A–C illustrate a problem arising in memory-element arrays as well as a solution to the problem. In FIGS. 6A–C, a small portion of a two-dimensional grid 602 of signal lines that, together with intervening semiconductor layers, forms a two-dimensional array of memory elements. As shown in FIG. 6A, a single memory element 604 may be read by applying a voltage differential to the vertical 606 and horizontal 608 signal lines that intersect to form the memory element 604, and determining the current passing through the memory element. However, as shown in FIG. 6B, current may flow through alternative paths through adjacent signal lines. In fact, current may potentially flow through each intersection in the two-dimensional array of memory elements when a voltage differential is applied to a single pair of intersecting signal lines. Because of these alternative paths, it is impossible to accurately measure the resistance of a single memory element in a simple array comprising a layer of PEDT/PSS sandwiched between two layers of parallel signal lines.

The alternative-current-path problem is addressed by preventing current flow through alternative paths. This can be done, as shown in FIG. 6C, by introducing a physical asymmetry or polarity within the two dimensional array. As shown in FIG. 6C, the asymmetry may constitute an electrical resistance polarity that has the effect of introducing diodes at each intersection between two signal lines. The alternative current paths, such as the alternative current path shown in FIG. 6B, involve current flowing through an intersection in a direction opposite to the direction of the current through the desired intersection, and so the alternative current pathways are eliminated by introducing a diode at each intersection, limiting current flow to a single direction.

Figure 7:
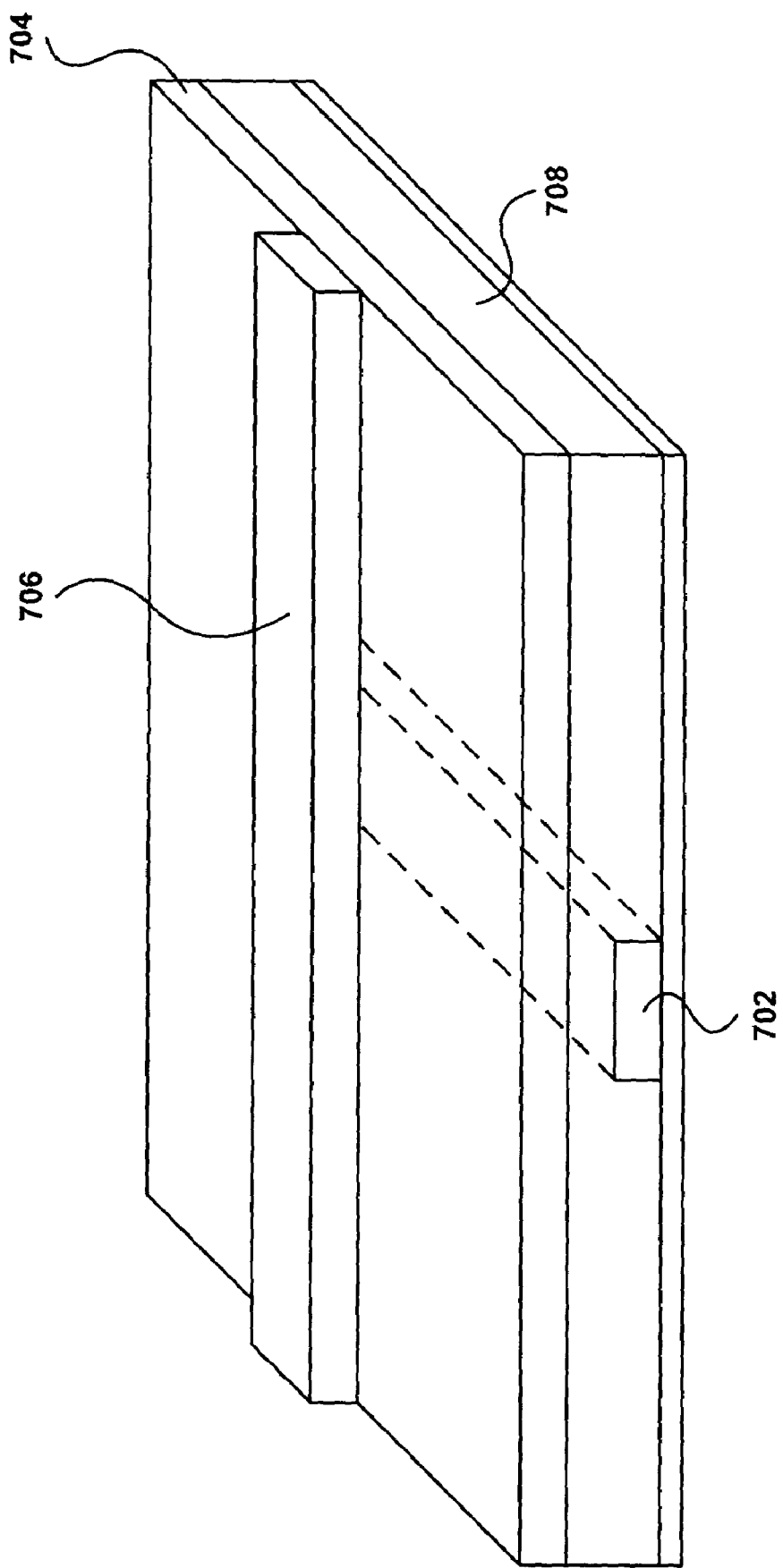
FIG. 7 shows one approach to introducing a diode within a memory element.

FIG. 7 shows one approach to introducing a diode within a memory element. FIG. 7 is similar to FIG. 2D, showing a first signal line 702, a layer of PEDT/PSS 704 formed above the first signal line, and a second signal line 706 above the PEDT/PSS layer. However, in addition, a second semiconductor layer 708, below the PEDT/PSS layer 704, serves to introduce a junction that acts as a diode. There are many different thin-film and traditional semiconductor materials, such as doped silicon, that act as diodes. Both the second semiconductor layer 708 and PEDT/PSS layer 704 can be further processed to remove the two layers in non-intersection regions, as the PEDT/PSS layer was shown to be further processed in FIG. 2E.

Figure 8:
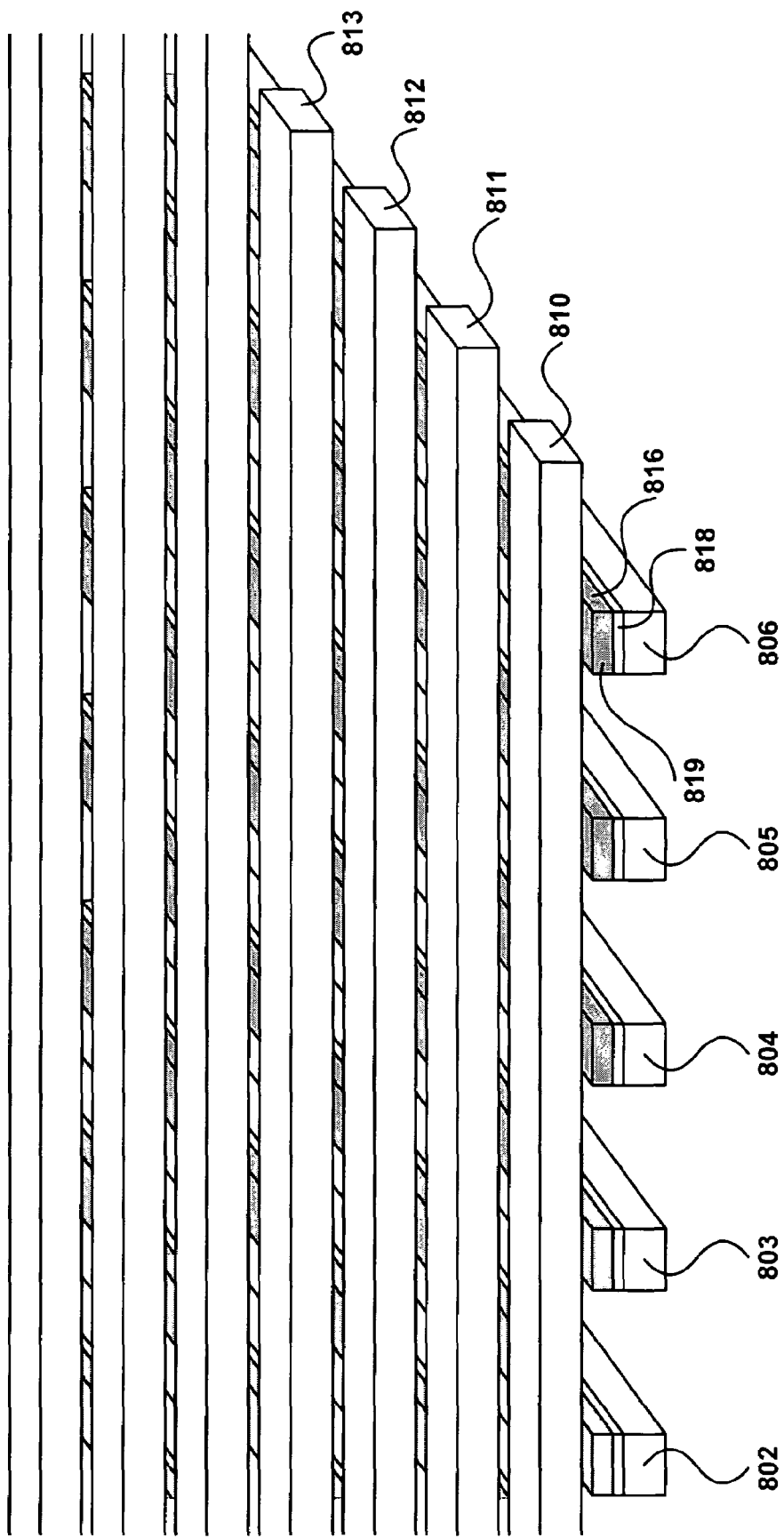
FIG. 8 shows a small section of such a high-density electronic memory.

FIG. 8 shows a small section of such a high-density electronic memory. In FIG. 8, a first set of parallel, microscale metallic signal lines 802–806 is separated from a second, approximately orthogonal set of parallel signal lines 810–813 by a large number of PEDT/PSS/silicon-bilayer-intersection volumes, such as bilayer intersection volume 816 comprising a doped silicon layer 818 and a PEDT/PSS layer 819. The PEDT/PSS/silicon-bilayer intersection volume separating each overlapping region of a first-set signal line and a second-set signal line constitutes a single, asymmetrical memory element within the high-density electronic memory. By applying a voltage differential to a signal line from the first set and a signal line from the second set of signal lines, the resulting current flow through the PEDT/PSS/silicon-bilayer-intersection volume element between the two signal lines indicates whether or not the PEDT/PSS intersection volume is in a first, relatively highly conductive, post-fabrication state or in a second, relatively less conductive, post-high-voltage-pulse state. As discussed above, the two states encode the two different possible binary bits, according to one of two different conventions in which the first and second states represent binary bits "1" and "0," or the binary bits "0" and "1," respectively.

A high-density electronic memory fabricated according to the above described embodiments satisfies many of the requirements for use in consumer-product applications. As discussed above, PEDT/PSS is resistant to hydrolysis, is thermally stable, and is stable with respect to self-degradation over time. The electronic memory has no moving parts nor exposed, unusually fragile components, and is therefore also mechanically stable. Well-known semiconductor-fabrication and optical coating techniques can be used in the manufacture of electronic memories incorporating embodiments of the present invention, leading to highly automated and inexpensive manufacture. Finally, the decrease in conductivity of PEDT/PSS following a high voltage pulse lies between two and three orders of magnitude, and is readily detectable by well-known sense amplification techniques.

Although the present invention has been described in terms of a particular embodiment, it is not intended that the invention be limited to this embodiment. Modifications within the spirit of the invention will be apparent to those skilled in the art. For example, various chemical modifications of either or both of the PEDT and PSS polymers may confer various desirable advantages to electronic memory elements and high-density electronic memories based on a conductive organic polymer layer. Various different sizes of polymers and different ratios of PEDT to PSS polymers, as well as different ionization states of functional groups within the polymers, may be employed to favorably alter both properties of a PEDT/PSS layer. Moreover, other types of conductive organic polymers may be used, including future organic polymers produced by current research in conductive organic polymers. Any of the various modified PEDT/PSS mixtures, or other conductive organic polymers or materials used for the transformable, conductive organic layer of the memory element needs to exhibit the above-described relatively highly conductive state at relatively low voltages, that can be transformed, upon application of a relatively high voltage spike, to a low-conductivity state that is easily distinguished from the relatively highly conductive state. It is desirable for the ratio of conductivities of the highly conductive and low-conductivity states to equal or exceed about 10,000, and preferable for the ratio to exceed 1,000,000. Of course, a polymer or polymer mixture that exhibits an opposite behavior, initially of low conductivity, and transformable via a voltage spike to a highly conductive state, is equally useful for fabricating a memory element. Many different types of architectures for high-density electronic memories may be employed to incorporate memory elements of the present invention. Cross-bar-like matrix architectures may prove to be of great efficiency and effectiveness, but other types of architectures may prove equally effective. The dimensions of the electronic-memory elements and the densities of electronic memories fabricated from them are constrained only by available fabrication techniques and the practically useful resistances exhibited by microscopic signal lines. For example, should nanoscale fabrication techniques prove practical, and the resistivity of nanoscale signal lines prove sufficiently low, nanoscale sized electronic memory elements may be fabricated by the techniques described above. While two-dimensional arrays and matrixes provide reasonable high density memories for current consumer-product applications, future electronic memories may incorporate additional layers of electronic memory elements, thus constituting a three-dimensional volume of electronic memory elements. In the above description, a single PEDT/PSS layer was formed above a first set of signal lines and below a second set of signal lines. In alternative embodiments, multiple layers may be employed, fabricated in separate stages, or more complex laminate-like layers of PEDT/PSS with different properties, or layers of other substances may be used to favorably alter both properties of the conductive polymer layer.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. An electronic switch comprising:
   a first conductor;
   a second conductor; and
   a rectifying switch layer between the first conductor and the second conductor composed of a conductive organic polymer layer and a semiconductor layer, a first surface of the conductive polymer layer in contact with the first conductor and a second surface of the conductive polymer layer in contact with the semiconductor layer, the conductive organic polymer layer in one of
      a first more-conductive state in which the organic polymer layer conducts current between the first conductor and the second conductor with a first conductivity, and
      a second less-conductive state, in which the organic polymer layer conducts current between the first conductor and the second conductor with a second conductivity substantially less than the first conductivity.

2. The electronic switch of claim 1 wherein the first conductor and the second conductor are microscale, metallic signal lines that intersect at an intersection point at which they are separated by a distance equal to the thickness of the rectifying switch layer.

3. The electronic switch of claim 1 wherein the conductive organic polymer layer comprises a dried, aqueous dispersion of a mixture of poly(3,4-ethylenedioxythiophene) and poly(styrene sulfonate).

4. The electronic switch of claim 3 wherein the conductive organic polymer layer, following deposition and drying, has the first conductivity, and is therefore in the first more-conductive state.

5. The electronic switch of claim 4 wherein the conductive organic polymer layer in the first more-conductive state transitions to the second less-conductive state following application of a pulse of a voltage differential between the first conductor and the second conductor.

6. The electronic switch of claim 1 wherein the first more-conductive state encodes a binary bit "1" and the second less-conductive state encodes a binary bit "0."

7. The electronic switch of claim 1 wherein the first more-conductive state encodes a binary bit "0" and the second less-conductive state encodes a binary bit "1."

8. The electronic switch of claim 1 incorporated as a memory element into a high-density, two-dimensional-matrix-like electronic memory.

9. The high-density, two-dimensional-matrix-like electronic memory of claim 8 incorporated within a consumer product.

10. The high-density, two-dimensional-matrix-like electronic memory of claim 9 wherein the consumer product is selected from among:
    a digital camera data storage cartridge;
    a write-once memory device for a computer;
    a handheld electronic communications device;
    a handheld computing device;
    a handheld electronic display;
    an electronic transaction device; and
    a electronic messaging device.

* * * * *